US012719298B2

(12) United States Patent
Tominaga et al.

(10) Patent No.: US 12,719,298 B2
(45) Date of Patent: Aug. 25, 2026

(54) OUTPUT CONTROL DEVICE FOR LITHIUM-ION BATTERY, OUTPUT CONTROL METHOD, AND STORAGE MEDIUM

(71) Applicant: HONDA MOTOR CO., LTD., Tokyo (JP)

(72) Inventors: Yuki Tominaga, Wako (JP); Hikaru Arai, Yokohama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 636 days.

(21) Appl. No.: 18/113,643

(22) Filed: Feb. 24, 2023

(65) Prior Publication Data

US 2023/0318343 A1 Oct. 5, 2023

(30) Foreign Application Priority Data

Mar. 30, 2022 (JP) ................................ 2022-057150

(51) Int. Cl.
*H02J 7/96* (2026.01)
*G01R 31/36* (2020.01)
(Continued)

(52) U.S. Cl.
CPC ............ *H02J 7/96* (2026.01); *G01R 31/3648* (2013.01); *G01R 31/3842* (2019.01); *H02J 7/94* (2026.01)

(58) Field of Classification Search
CPC ............. H02J 7/007182; H02J 7/00714; H02J 7/0047; H02J 7/0048; G01R 31/3648;
(Continued)

(56) References Cited

U.S. PATENT DOCUMENTS 6,285,163 B1 9/2001 Watanabe et al.
2019/0067954 A1* 2/2019 Ohkawa .................. B60L 58/12
2024/0204548 A1* 6/2024 Kobayashi ................ H02J 3/38

FOREIGN PATENT DOCUMENTS

CN 110058118 A * 7/2019 ........... G01R 31/385
JP 11-122834 4/1999
(Continued)

OTHER PUBLICATIONS

Japanese Office Action for Japanese Patent Application No. 2022-057150 dated Jan. 23, 2024.

*Primary Examiner* — Yossef Korang-Beheshti
(74) *Attorney, Agent, or Firm* — Amin, Turocy & Watson, LLP

(57) ABSTRACT

An output control device for a lithium-ion battery includes: a voltage measuring unit configured to measure an output voltage of the lithium-ion battery; a current measuring unit configured to measure an output current of the lithium-ion battery; a storage unit configured to store measurement results from the voltage measuring unit and the current measuring unit; a calculation unit configured to calculate a voltage and a current which are to be output from the lithium-ion battery on the basis of the measurement results from the voltage measuring unit and the current measuring unit; and a control unit configured to perform feedback control of the output current and the output voltage of the lithium-ion battery on the basis of a calculation result from the calculation unit.

6 Claims, 2 Drawing Sheets

(51) Int. Cl.
*G01R 31/3842* (2019.01)
*H02J 7/94* (2026.01)

(58) Field of Classification Search
CPC .. G01R 31/3842; Y02E 60/10; H01M 1/0525; H01M 10/44
See application file for complete search history.

(56) References Cited

FOREIGN PATENT DOCUMENTS

| | | |
|---|---|---|
| JP | 2005-156351 | 6/2005 |
| JP | 2015-230235 | 12/2015 |
| JP | 2020-182262 | 11/2020 |
| JP | 2021-082426 | 5/2021 |
| WO | 99/61929 | 12/1999 |
| WO | 2011/136143 | 11/2011 |

* cited by examiner

OUTPUT CONTROL DEVICE FOR LITHIUM-ION BATTERY, OUTPUT CONTROL METHOD, AND STORAGE MEDIUM

CROSS-REFERENCE TO RELATED APPLICATION

Priority is claimed on Japanese Patent Application No. 2022-057150, filed Mar. 30, 2022, the content of which is incorporated herein by reference.

BACKGROUND OF THE INVENTION

Field of the Invention

The present invention relates to an output control device for a lithium-ion battery, an output control method, and a storage medium.

Description of Related Art

Interest in electric vehicles has increased for the purpose of reduction of $CO_2$ in view of curbing occurrence of climate-related disasters. Use of lithium-ion batteries as onboard batteries has been studied.

Japanese Unexamined Patent Application, First Publication No. 2020-182262 describes that change of a charging electric power limit value with respect to time is calculated and the charging electric power limit value is set to a maximum value of charging electric power with which high-rate deterioration does not occur.

Japanese Unexamined Patent Application, First Publication No. 2021-082426 describes that a charging current for a battery is limited by a maximum charging current while curbing high-rate deterioration.

PCT International Publication No. WO 1999/061929 describes that a dynamic voltage variation based on a voltage variation of a battery and change of a charging current of the battery is estimated.

SUMMARY OF THE INVENTION

In the patent documents, it is disclosed that electric power is limited in consideration of deterioration of a secondary battery at the time of supply of electric power at a high rate, but output control of a lithium-ion battery is not disclosed.

A closed-circuit voltage (CCV) (unit: volt) which is output characteristics of a lithium-ion battery can be expressed by Expression (1).

$$CCV=OCV-I\times R \quad (1)$$

Here, OCV denotes an open-circuit voltage (unit: volt), I denotes an output current (unit: ampere), and R denotes an internal resistance (unit: ohm) of the lithium-ion battery.

In general, since the internal resistance (R) does not depend on the output current (I), a relationship between the closed-circuit voltage (CCV) and the output current (I) (I-V characteristics) is linear. When the output current (I) increases, the I-V characteristics may be nonlinear.

When the I-V characteristics are nonlinear and depart greatly from being linear, an output (W) (unit: watt) of the lithium-ion battery decreases even if the output current (I) increases. As a result, an output (W) suitable for consumption of a state of charge (SOC) of the lithium-ion battery is not obtained.

Aspects of the present invention were invented in consideration of the aforementioned circumstances, and an objective thereof is to provide an output control device, an output control method, and a storage medium for output control of a lithium-ion battery that can improve an output and output efficiency at the time of output of a large current.

In order to achieve the aforementioned objective, the present invention employs the following aspects.

(1) According to an aspect of the present invention, there is provided an output control device, the output control device including: a voltage measuring unit configured to measure an output voltage of a lithium-ion battery; a current measuring unit configured to measure an output current of the lithium-ion battery; a storage unit configured to store measurement results from the voltage measuring unit and the current measuring unit; a calculation unit configured to calculate a voltage and a current which are to be output from the lithium-ion battery on the basis of the measurement results from the voltage measuring unit and the current measuring unit; and a control unit configured to perform feedback control of the output current and the output voltage of the lithium-ion battery on the basis of a calculation result from the calculation unit, wherein the control unit is configured to perform control for monitoring an output electric power of the lithium-ion battery while increasing the output current of the lithium-ion battery and stopping an increase of the output current of the lithium-ion battery at a time point at which a rate of change of the output electric power per unit time $\Delta W$ becomes close to zero.

(2) According to another aspect of the present invention, there is provided an output control device for a lithium-ion battery, the output control device including: a voltage measuring unit configured to measure an output voltage of the lithium-ion battery; a current measuring unit configured to measure an output current of the lithium-ion battery; a storage unit configured to store measurement results from the voltage measuring unit and the current measuring unit; a calculation unit configured to calculate a voltage and a current which are to be output from the lithium-ion battery on the basis of the measurement results from the voltage measuring unit and the current measuring unit; and a control unit configured to perform feedback control of the output current and the output voltage of the lithium-ion battery on the basis of a calculation result from the calculation unit, wherein the control unit is configured to perform control for monitoring the output current of the lithium-ion battery while increasing the output current of the lithium-ion battery and stopping an increase of the output current of the lithium-ion battery at a time point at which a value $\Delta W/\Delta I$ obtained by dividing a rate of change of an output electric power per unit time $\Delta W$ by a rate of change of the output current per unit time $\Delta I$ becomes equal to or less than a preset threshold value.

(3) According to another aspect of the present invention, there is provided an output control device for a lithium-ion battery, the output control device including: a voltage measuring unit configured to measure an output voltage of the lithium-ion battery; a current measuring unit configured to measure an output current of the lithium-ion battery; a storage unit configured to store measurement results from the voltage measuring unit and the current measuring unit; a calculation unit configured to calculate a voltage and a current which are to be output from the lithium-ion battery on the basis of the measurement results from the voltage measuring unit and the current measuring unit; and a control unit configured to perform feedback control of the output current and the output voltage of the lithium-ion battery on the basis of a calculation result from the calculation unit, wherein the control unit is configured to perform: control for monitoring an output electric power of the lithium-ion battery while increasing the output current of the lithium-ion battery and stopping an increase of the output current of the lithium-ion battery at a time point at which a rate of change of the output electric power per unit time ΔW becomes close to zero; and control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value, selectively according to an output mode.

(4) According to another aspect of the present invention, there is provided an output control method, the output control method including: by causing a computer to give an instruction to an output control device for a lithium-ion battery, performing control for monitoring an output electric power of the lithium-ion battery while increasing an output current of the lithium-ion battery and stopping an increase of the output current of the lithium-ion battery at a time point at which a rate of change of the output electric power per unit time ΔW becomes close to zero.

(5) According to another aspect of the present invention, there is provided an output control method for a lithium-ion battery, the output control method including: by causing a computer to give an instruction to an output control device for the lithium-ion battery, performing control for monitoring an output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value.

(6) According to another aspect of the present invention, there is provided an output control method for a lithium-ion battery, the output control method including: by causing a computer to give an instruction to an output control device for the lithium-ion battery, performing control for monitoring an output electric power of the lithium-ion battery while increasing the output current of the lithium-ion battery and stopping an increase of the output current of the lithium-ion battery at a time point at which a rate of change of the output electric power per unit time ΔW becomes close to zero and control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value, selectively according to an output mode.

(7) According to another aspect of the present invention, there is provided a storage medium storing a program causing a computer to perform: giving an instruction to an output control device for a lithium-ion battery; and causing the output control device to perform control for monitoring an output electric power of the lithium-ion battery while increasing an output current of the lithium-ion battery and stopping an increase of the output current of the lithium-ion battery at a time point at which a rate of change of the output electric power per unit time ΔW becomes close to zero.

(8) According to another aspect of the present invention, there is provided a storage medium storing a program causing a computer to perform: giving an instruction to an output control device for a lithium-ion battery; and causing the output control device to perform control for monitoring an output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value.

(9) According to another aspect of the present invention, there is provided a storage medium storing a program causing a computer to perform: giving an instruction to an output control device for a lithium-ion battery; and causing the output control device to perform control for monitoring an output electric power of the lithium-ion battery while increasing the output current of the lithium-ion battery and stopping an increase of the output current of the lithium-ion battery at a time point at which a rate of change of the output electric power per unit time ΔW becomes close to zero and control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value, selectively according to an output mode.

According to the aspects of (1), (4), and (7), it is possible to perform control using a maximum output electric power of the lithium-ion battery.

According to the aspects of (2), (5), and (8), it is possible to perform control using a maximum output-efficiency electric power of the lithium-ion battery.

According to the aspects of (3), (6), and (9), it is possible to selectively perform control using a maximum output electric power of the lithium-ion battery and control using a maximum output-efficiency electric power of the lithium-ion battery.

DETAILED DESCRIPTION OF THE INVENTION

Hereinafter, embodiments of an output control device, an output control method, and a storage medium for controlling an output of a lithium-ion battery according to the present invention will be described with reference to the accompanying drawings.

<Configuration of Output Control Device>

Figure 1:
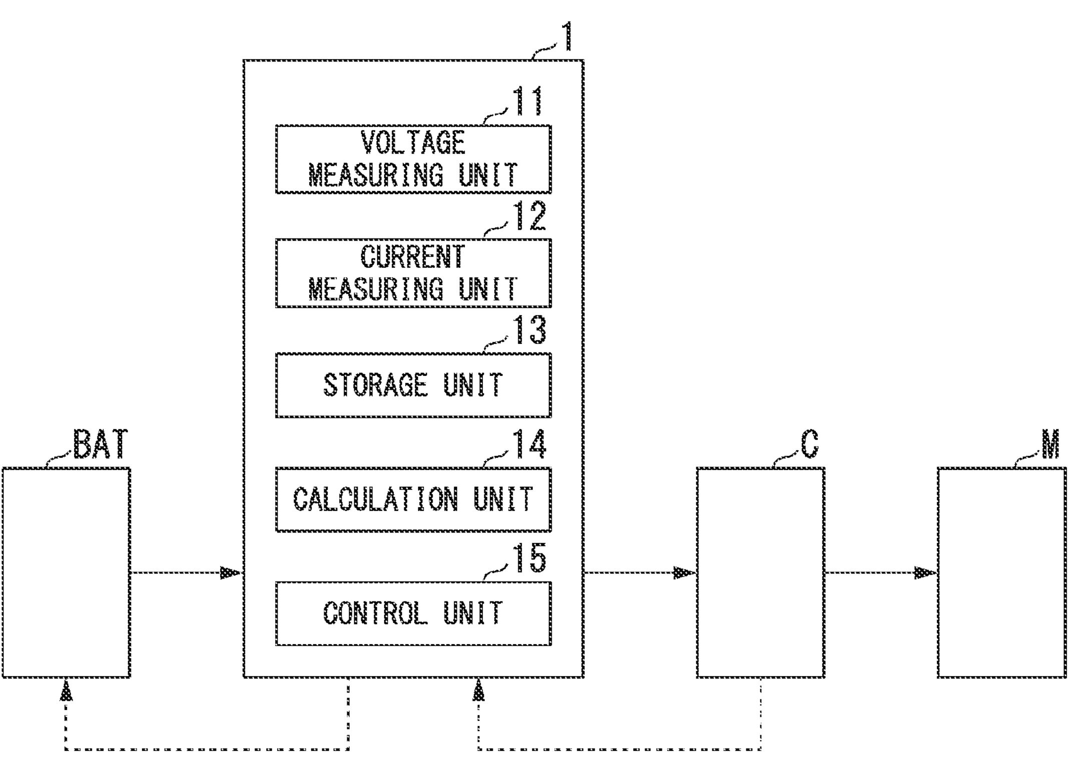
FIG. 1 is a block diagram illustrating a configuration of a principal part of an output control device according to an embodiment of the present invention.

FIG. 1 is a block diagram illustrating a configuration of a principal part of an electric vehicle comprising a lithium-ion battery BAT, a controller C, an element M, and an output control device according to an embodiment of the present invention. As illustrated in FIG. 1, the output control device 1 includes a voltage measuring unit 11 configured to measure an output voltage of the lithium-ion battery BAT, a current measuring unit 12 configured to measure an output current of the lithium-ion battery BAT, a storage unit 13 configured to store measurement results from the voltage measuring unit 11 and the current measuring unit 12, a calculation unit 14 configured to calculate a voltage and a current which are to be output from the lithium-ion battery BAT on the basis of the measurement results from the voltage measuring unit 11 and the current measuring unit 12, and a control unit 15 configured to perform feedback control of the output current and the output voltage of the lithium-ion battery BAT on the basis of a calculation result from the calculation unit 14.

In a first embodiment of the output control device 1, control is performed such that an output electric power W of the lithium-ion battery BAT is monitored while increasing an output current I of the lithium-ion battery BAT and an increase of the output current I of the lithium-ion battery BAT is stopped at a time point at which a rate of change of the output electric power W per unit time $\Delta W$ becomes close to zero.

In a second embodiment of the output control device 1, control is performed such that the output current I of the lithium-ion battery BAT is monitored while increasing the output current I of the lithium-ion battery BAT and an increase of the output current I of the lithium-ion battery BAT is stopped at a time point at which a value $\Delta W/\Delta I$ obtained by dividing a rate of change of the output electric power W per unit time $\Delta W$ by a rate of change of the output current I per unit time $\Delta I$ becomes equal to or less than a preset threshold value.

In a third embodiment of the output control device 1, control is performed such that the first embodiment and the second embodiment switch according to an output mode.

Figure 2:
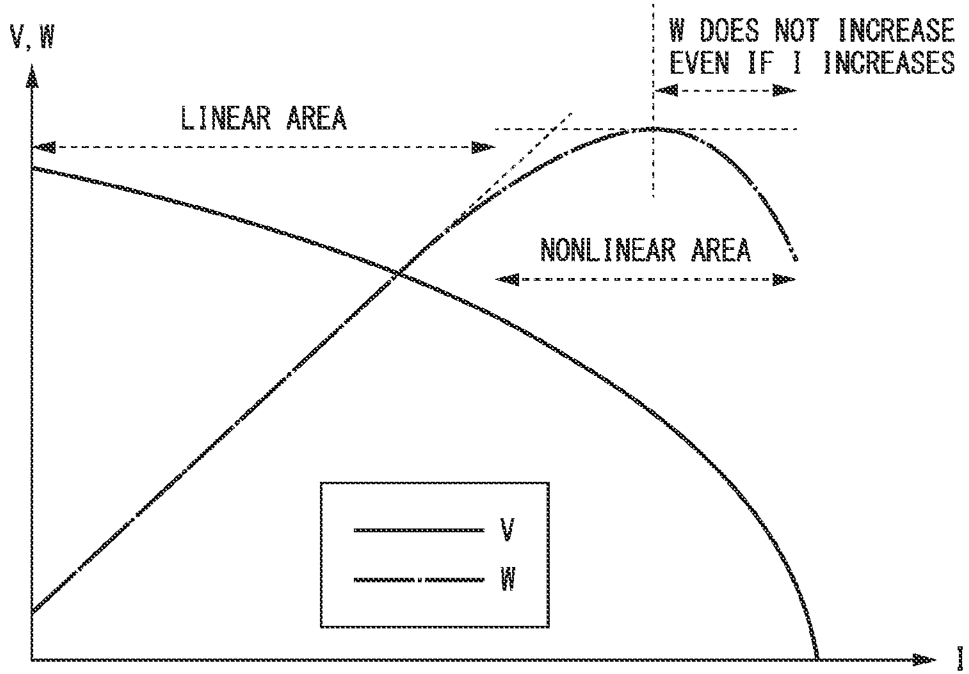
FIG. 2 is a graph illustrating a relationship between an output current I and an output voltage V or an output electric power W of a lithium-ion battery.

FIG. 2 is a graph illustrating a relationship between the output current I and the output voltage V or the output electric power W of a lithium-ion battery. I-V characteristics are linear when the output current I is less than a certain value, but are nonlinear when the output current I is greater than the certain value. In a nonlinear area, the output electric power W does not increase even if the output current I increases, and decreases in some cases.

Figure 3:
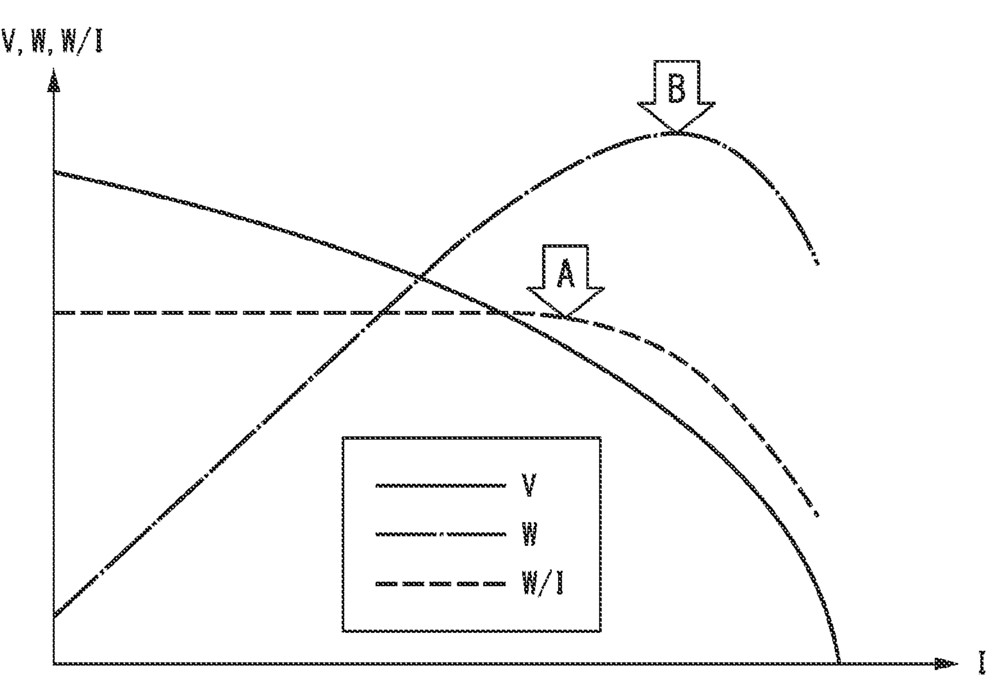
FIG. 3 is a graph illustrating a relationship between an output current I and an output voltage V, an output electric power W, or a value W/ΔI obtained by diving the output electric power W by the output current I of a lithium-ion battery.

FIG. 3 is a graph illustrating a relationship between an output current I and an output voltage V, an output electric power W, or a value W/I obtained by diving the output electric power W by the output current I of a lithium-ion battery. A value (B) of I at which the output electric power W of the lithium-ion battery is maximized and a value (A) of I at which electric power efficiency W/I is maximized are different. Control using a maximum output electric power and control using maximum electric power efficiency can be selectively performed or can switch.

An example of a control method in the electric vehicle will be more specifically described below.

In the first embodiment (an instruction for a maximum output), I is slowly increased for the purpose of prevention of slip of tires with outputs of 2R and 4R. An output electric power (W) of a battery at that time is monitored while I is being increased, and an increase of I is stopped at a time point at which a rate of change ($\Delta W$) of W per unit time becomes close to zero. Accordingly, control using the maximum electric power W of the lithium-ion battery can be performed at that time.

In the second embodiment (an instruction for maximum output efficiency), $\Delta W/\Delta I$ is calculated and monitored with respect to the rate of change ($\Delta I$) of I per unit time while I is being increased. An increase of I is stopped at a time point at which the value of $\Delta W/\Delta I$ at the time of output reaches a preset criteria (for example, 90%) for the value of $\Delta W/\Delta I$ at the beginning of output. Accordingly, control using the maximum output efficiency W of the lithium-ion battery can be performed at that time.

The control unit 15, the calculation unit 14, and the storage unit 13 out of the elements of the aforementioned output control device 1 are implemented, for example, by causing a hardware processor such as a central processing unit (CPU) to execute a program (software). Some or all of such elements may be implemented by hardware (a circuit unit including circuitry) such as a large scale integration (LSI) circuit, an application-specific integrated circuit (ASIC), a field-programmable gate array (FPGA), or a graphics processing unit (GPU) or may be cooperatively implemented by software and hardware. The program may be stored in a storage device (a storage device including a non-transitory storage medium) such as a hard disk drive (HDD) or a flash memory in advance or may be stored in a removable storage medium (a non-transitory storage medium) such as a DVD or a CD-ROM and be installed by setting the storage medium to a drive device.

The aforementioned embodiment can also be described as follows:

An output control device including:

a storage medium storing computer-readable instructions; and a processor connected to the storage medium, wherein the processor executes the computer-readable instructions to perform: control for monitoring an output electric power W of a lithium-ion battery BAT while increasing an output current I of the lithium-ion battery BAT and stopping an increase of the output current I of the lithium-ion battery BAT at a time point at which a rate of change of the output electric power W per unit time $\Delta W$ becomes close to zero; or control for monitoring the output current I of the lithium-ion battery BAT while increasing the output current I of the lithium-ion battery BAT and stopping an increase of the output current I of the lithium-ion battery BAT at a time point at which a value $\Delta W/\Delta I$ obtained by dividing a rate of change of the output electric power W per unit time $\Delta W$ by a rate of change of the output current I per unit time $\Delta I$ becomes equal to or less than a preset threshold value.

While a mode for carrying out the present invention has been described above with reference to an embodiment, the present invention is not limited to the embodiment, and various modifications and substitutions can be performed thereon without departing from the gist of the present invention.

What is claimed is:

1. An output control device for a lithium-ion battery, the output control device comprising:

a memory that stores a program; and a processor that, upon execution of the program, is configured to operate as:

a storage unit configured to store measurement results, wherein the measurement results comprise an output voltage of the lithium-ion battery and an output current of the lithium-ion battery;

a calculation unit configured to output a voltage and a current which are to be output from the lithium-ion battery on the basis of the measurement results; and a control unit configured to perform feedback control of the output current and the output voltage of the lithium-ion battery on the basis of an output result from the calculation unit, wherein the control unit, upon execution of the program, is configured to perform control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value.

2. An output control device for a lithium-ion battery, the output control device comprising:

a memory that stores a program; and a processor that, upon execution of the program, is configured to operate as:

a storage unit configured to store measurement results, wherein the measurement results comprise an output voltage of the lithium-ion battery and an output current of the lithium-ion battery;

a calculation unit configured to output a voltage and a current which are to be output from the lithium-ion battery on the basis of the measurement results; and a control unit configured to perform feedback control of the output current and the output voltage of the lithium-ion battery on the basis of an output result from the calculation unit, wherein the control unit, upon execution of the program, is configured to perform:

control for monitoring an output electric power of the lithium-ion battery while increasing the output current of the lithium-ion battery and stopping an increase of the output current of the lithium-ion battery at a time point at which a rate of change of the output electric power per unit time ΔW becomes close to zero; and control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value, selectively according to an output mode.

3. An output control method for a lithium-ion battery, the output control method comprising: by causing a computer to give an instruction to an output control device for the lithium-ion battery, performing control for monitoring an output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value.

4. An output control method for a lithium-ion battery, the output control method comprising: by causing a computer to give an instruction to an output control device for the lithium-ion battery, performing control for monitoring an output electric power of the lithium-ion battery while increasing an output current of the lithium-ion battery and stopping an increase of the output current of the lithium-ion battery at a time point at which a rate of change of the output electric power per unit time ΔW becomes close to zero, and control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value, selectively according to an output mode.

5. A non-transitory computer-readable storage medium storing a program causing a computer to perform:

giving an instruction to an output control device for a lithium-ion battery; and causing the output control device to perform control for monitoring an output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value.

6. A non-transitory computer-readable storage medium storing a program causing a computer to perform:

giving an instruction to an output control device for a lithium-ion battery; and causing the output control device to perform control for monitoring an output electric power of the lithium-ion battery while increasing an output current of the lithium-ion battery and stopping an increase of the output current of the lithium-ion battery at a time point at which a rate of change of the output electric power per unit time ΔW becomes close to zero, and control for monitoring the output current of the lithium-ion battery while increasing the output current of the lithium-ion battery and stopping an increase of the output current of the lithium-ion battery at a time point at which a value ΔW/ΔI obtained by dividing a rate of change of an output electric power per unit time ΔW by a rate of change of the output current per unit time ΔI becomes equal to or less than a preset threshold value, selectively according to an output mode.

* * * * *